(12) United States Patent
Jeong et al.

(10) Patent No.: US 7,396,729 B2
(45) Date of Patent: Jul. 8, 2008

(54) METHODS OF FORMING SEMICONDUCTOR DEVICES HAVING A TRENCH WITH BEVELED CORNERS

(75) Inventors: Chul Jeong, Gyeonggi-do (KR); Wook-Hyoung Lee, Gyeonggi-do (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 184 days.

(21) Appl. No.: 11/216,661

(22) Filed: Aug. 31, 2005

(65) Prior Publication Data
US 2006/0051926 A1 Mar. 9, 2006

(30) Foreign Application Priority Data
Sep. 7, 2004 (KR) ............... 10-2004-0071389

(51) Int. Cl.
*H01L 21/336* (2006.01)
*H01L 21/76* (2006.01)
*H01L 21/31* (2006.01)

(52) U.S. Cl. ............. 438/296; 438/426; 438/435; 438/770; 438/786; 257/E21.546; 257/E21.55; 257/E21.628

(58) Field of Classification Search .......... 438/426, 438/435, 423, 701, 756, 770, 769; 257/E21.55, 257/E21.553, E21.628
See application file for complete search history.

(56) References Cited

U.S. PATENT DOCUMENTS

| | | | |
|---|---|---|---|
| 6,599,810 B1 * | 7/2003 | Kepler et al. ............. | 438/424 |
| 6,709,924 B1 | 3/2004 | Yu et al. .................. | 438/257 |
| 6,734,072 B1 * | 5/2004 | Chong et al. ............. | 438/306 |
| 6,825,544 B1 * | 11/2004 | Jin ......................... | 257/499 |
| 2002/0182826 A1 | 12/2002 | Cheng et al. ............. | 438/433 |
| 2003/0181049 A1 * | 9/2003 | Huang et al. ............ | 438/694 |

FOREIGN PATENT DOCUMENTS

| | | |
|---|---|---|
| KR | 1020040003892 A | 1/2004 |
| KR | 1020040008519 A | 1/2004 |

\* cited by examiner

*Primary Examiner*—Michael S. Lebentritt
*Assistant Examiner*—Ron E Pompey
(74) *Attorney, Agent, or Firm*—Myers Bigel Sibley & Sajovec, P.A.

(57) ABSTRACT

A semiconductor device is formed by providing a substrate. A trench is formed in the substrate. Beveled surfaces are formed at upper portions of sidewalls of the trench opposite a bottom surface of the trench, respectively. An oxide layer is formed in the trench such that the oxide layer is thicker on the beveled surfaces of the trench than on other surfaces of the trench.

29 Claims, 6 Drawing Sheets

METHODS OF FORMING SEMICONDUCTOR DEVICES HAVING A TRENCH WITH BEVELED CORNERS

CROSS-REFERENCE TO RELATED APPLICATION

This application claims the benefit under 35 USC § 119 of Korean Patent Application No. 2004-71389, filed Sep. 7, 2004, the disclosure of which is hereby incorporated herein by reference in its entirety.

BACKGROUND OF THE INVENTION

1. Field of the Invention

The present invention relates to methods of forming a semiconductor device and, more particularly, to methods of forming semiconductor devices having field isolation layers.

2. Description of Related Art

In a procedure for forming semiconductor devices, it may be necessary to form field isolation layers. Conventionally, the edge of a field isolation layer is formed to have a substantially right angle. If a gate pattern is formed to reach the edge of the field isolation layer in a subsequent process, then leakage current may be generated at the edge of the field isolation layer.

Specifically, in a semiconductor device such as a NOR flash memory device, a process of forming a field isolation layer may have a direct effect on a profile of a tunnel oxide layer. Thus, program and erase operations and the reliability of the semiconductor device may be affected.

A conventional method of forming a field isolation layer and a floating gate electrode using self-alignment will now be described. A pad oxide pattern and a mask pattern are sequentially stacked on a semiconductor substrate. Using the patterns as etch masks, the semiconductor substrate is patterned to form trenches thereat. After filling the trench with field isolation material, a planarization process is performed to form a filled isolation layer. The mask pattern and the pad oxide pattern are sequentially removed. Generally, the removal of the pad oxide pattern is done using a wet etch. During the wet etch, a boundary portion of the field isolation layer and the pad oxide layer is etched more than the other portions. Accordingly, the edge of the field isolation layer may be dug. A thermal oxidation process is performed on a semiconductor substrate exposed by removing the pad oxide pattern to form a tunnel oxide layer. Oxygen is rarely supplied to the dug portion during the thermal oxidation process, which may prevent smooth formation of a tunnel oxide layer. As a result, the tunnel oxide layer may be thinly formed. A polysilicon layer is stacked to bury spaces between the field isolation layers. A planarization process is performed to form a floating gate electrode. In a subsequent process, an intergate dielectric and a control gate electrode are formed to construct a flash memory device. Thus, the edge of the field isolation layer may be dug and the tunnel oxide layer may be thinly formed in a flash memory device. When the flash memory device is programmed/erased or generally operates, leakage current may be generated at the edge of the field isolation layer, which may decrease the reliability of the semiconductor device.

SUMMARY OF THE INVENTION

According to some embodiments of the present invention, a semiconductor device is formed by providing a substrate. A trench is formed in the substrate. Beveled surfaces are formed at upper portions of sidewalls of the trench opposite a bottom surface of the trench, respectively. An oxide layer is formed in the trench such that the oxide layer is thicker on the beveled surfaces of the trench than on other surfaces of the trench.

In other embodiments of the invention, defects are formed in the beveled surfaces of the trench.

In still other embodiments of the invention, the defects are formed by implanting ions in the beveled surfaces of the trench.

In still other embodiments of the invention, the ions are implanted in the beveled surfaces at a tilt angle of about 0-60 degrees.

In still other embodiments of the invention, the ions are implanted using boron (B), boron fluoride ($BF_2$), phosphorus (P), and/or arsenic (As).

In still other embodiments of the invention, the trench is filled with a field isolation material.

In further embodiments of the present invention, a semiconductor device is formed that has a field isolation layer, which may reduce or prevent leakage currents to enhance reliability of the semiconductor device. A pad oxide pattern and a mask pattern may be sequentially stacked on a semiconductor substrate to expose the substrate. Using the mask pattern as an etch mask, the exposed substrate is patterned to form a trench. A corner of the substrate contacting the end of the pad oxide pattern at an upper end of the trench is partially removed to form a facet region. An ion implanting process is performed on the facet region to make defects. An oxidation process "OX1" is performed to form a thick oxide layer on the facet region. The trench is filled with a field isolation material.

In other embodiments of the invention, the oxidation process "OX1" is performed under an ambient comprising $O^{2-}$ and $NO_x^-$.

In still other embodiments of the invention, the formation of the facet region includes performing an oxidation process "OX2" for the substrate including the trench to oxidize the corner of the substrate contacting the end of the pad oxide pattern and performing an etch process to remove the oxidized corner. The oxidation process "OX2" may be performed under an ambient comprising steam ($H_2O$), oxygen radical ($O^{2-}$), and/or hydroxyl radical ($OH^-$). The ambient of the oxidation process "OX2" may comprise hydrogen ($H_2$) and oxygen ($O_2$). The oxidation process "OX2" may be performed at a lower pressure than the oxidation process "OX1."

In still other embodiments, prior to formation of the trench, an oxidation process "OX3" is performed for the exposed substrate to form an oxide layer on the exposed substrate. The oxide layer is patterned when the trench is formed. The oxidation process "OX3" may be performed under an ambient comprising steam ($H_2O$), oxygen radical ($O^{2-}$), and/hydroxyl radical ($OH^-$). The ambient of the oxidation process "OX3" may comprise hydrogen ($H_2$) and oxygen ($O_2$). The oxidation process "OX2" may be performed at a lower pressure than the oxidation process "OX3.

In still other embodiments, the etch process to remove the oxidized corner is performed using hydrofluoric acid (HF). The ion implanting process may be performed at a tilt angle of about 0-60 degrees. The ion implanting process may be performed using boron (B), boron fluoride ($BF_2$), phosphorus (P), and arsenic (As).

DETAILED DESCRIPTION OF EMBODIMENTS

Figure 1:
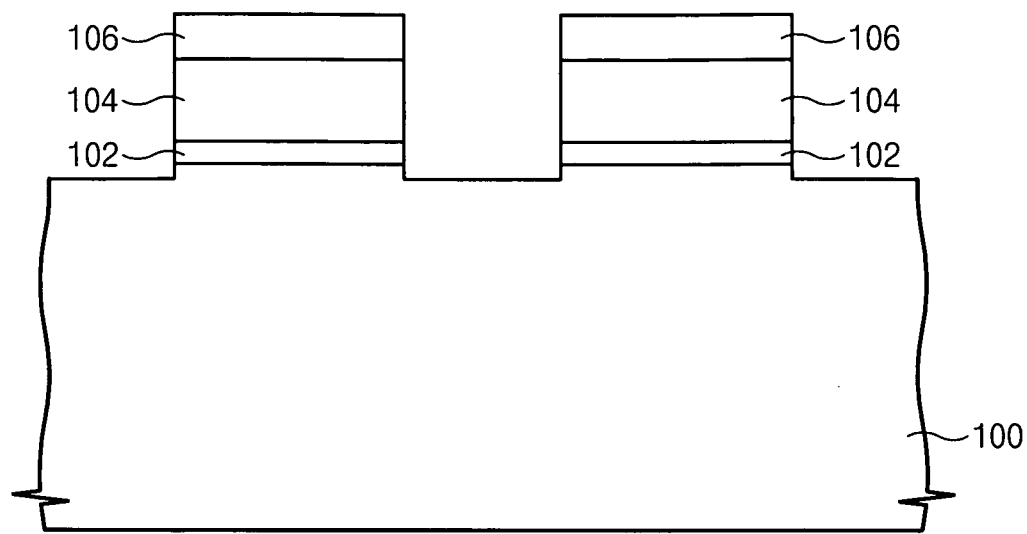
FIGS. 1-9 are cross-sectional diagrams that illustrate formation of a semiconductor device having field isolation layers according to some embodiments of the present invention.

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout the description of the figures.

It will be understood that when an element is referred to as being "on" another element, it can be directly on the other element or intervening elements may be present. In contrast, when an element is referred to as being "directly on" another element, there are no intervening elements present. As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first thin film could be termed a second thin film, and, similarly, a second thin film could be termed a first thin film without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the figures. It will be understood that relative terms are intended to encompass different orientations of the device in addition to the orientation depicted in the figures. For example, if the device in one of the figures were turned over, elements described as being on the "lower" side of other elements would then be oriented on "upper" sides of the other elements. The exemplary term "lower," can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein, but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Methods of forming a semiconductor device having field isolation layers, according to some embodiments of the present invention, will be described with reference to FIG. 1 through FIG. 9.

As illustrated in FIG. 1, a pad oxide layer 102, a mask nitride layer 104, and a mask oxide layer 106 are sequentially stacked on a semiconductor substrate 100. The mask oxide layer 108 may comprise medium temperature oxide (MTO). The mask oxide layer 106 may be patterned using a photoresist pattern (not shown). The photoresist pattern is removed. Using the mask oxide layer 106 as an etch mask, the mask nitride 104 and the pad oxide layer 102 are successively patterned to expose the substrate 100 and to form a pad oxide pattern 102, a mask nitride pattern 104, and a mask oxide pattern 106, which are stacked in the order named. In the patterning process, a top of the substrate 100 may be overetched, as shown in FIG. 1.

Figure 2:
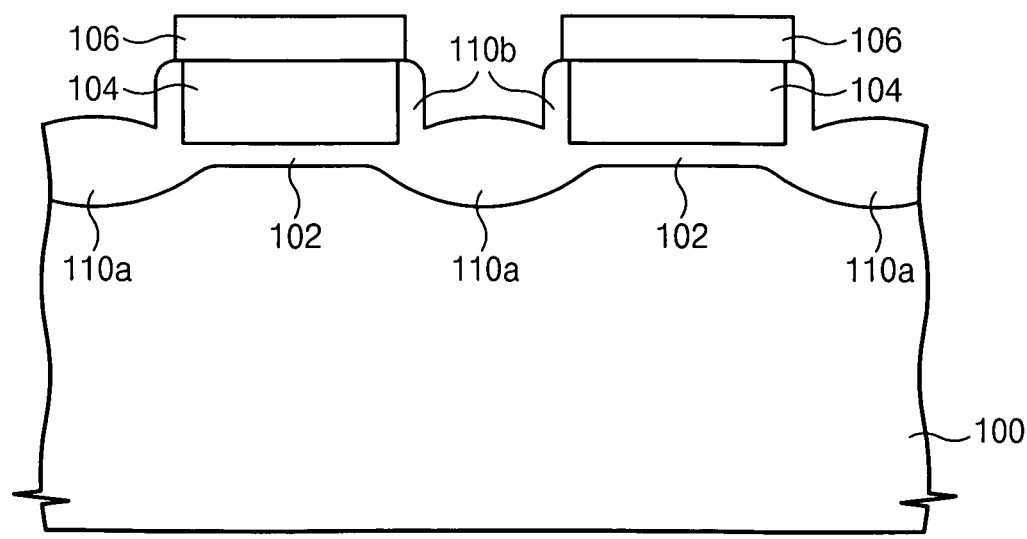

As illustrated in FIG. 2, a first oxidation process is performed for the substrate 100 where the pad oxide pattern 102, the mask nitride pattern 104, and the mask oxide pattern 106 are sequentially stacked. The first oxidation process may be an in-situ steam generation (ISSG) process performed under an ambient containing steam ($H_2O$), oxygen radical ($O^{2-}$), and hydroxyl radical ($OH^-$). The ambient may be made by supplying nitrogen and oxygen. The ISSG process may be performed at a temperature of about 950-1050 degrees centigrade and a pressure of about 7.5-20 Torr. A first oxide layer 110a is thickly formed at the substrate exposed by the first oxidation process, and a first oxide layer 110b is formed at a surface of the mask nitride pattern 104. The first oxide layers 110a and 110b may comprise silicon oxynitride (SiON) and silicon oxide ($SiO_2$), respectively. The first oxide layer 110a may be very thick like a bird's beak, so that the edge of the pad oxide layer 102 becomes thick. Thus, a corner of the substrate 100 below both sides of the mask nitride pattern 104 may be rounded.

Figure 3:
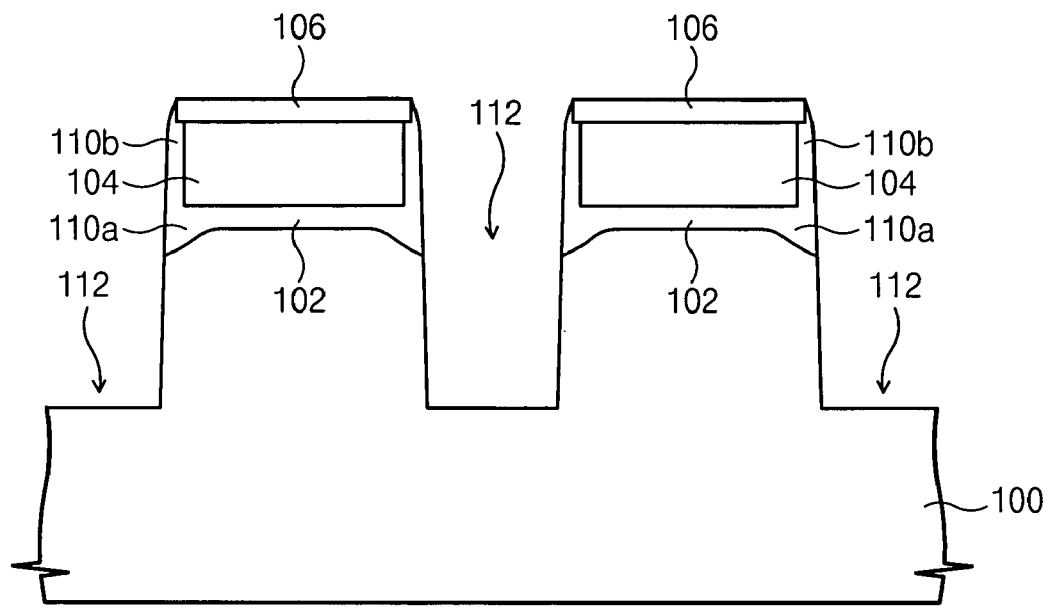

As illustrated in FIG. 3, using the mask oxide pattern 106 and the mask nitride pattern 104 as etch masks, the first oxide layers 110a and 110b and the substrate 100 are anisotropically etched to form a trench 112. In spite of the anisotropic etch, the first oxide layers 110a and 110b may remain on a lateral face of the mask nitride pattern 104 and both edges of the pad oxide layer 102. An upper portion of the mask oxide pattern 106 may be partially etched during the anisotropic etch.

Figure 4:
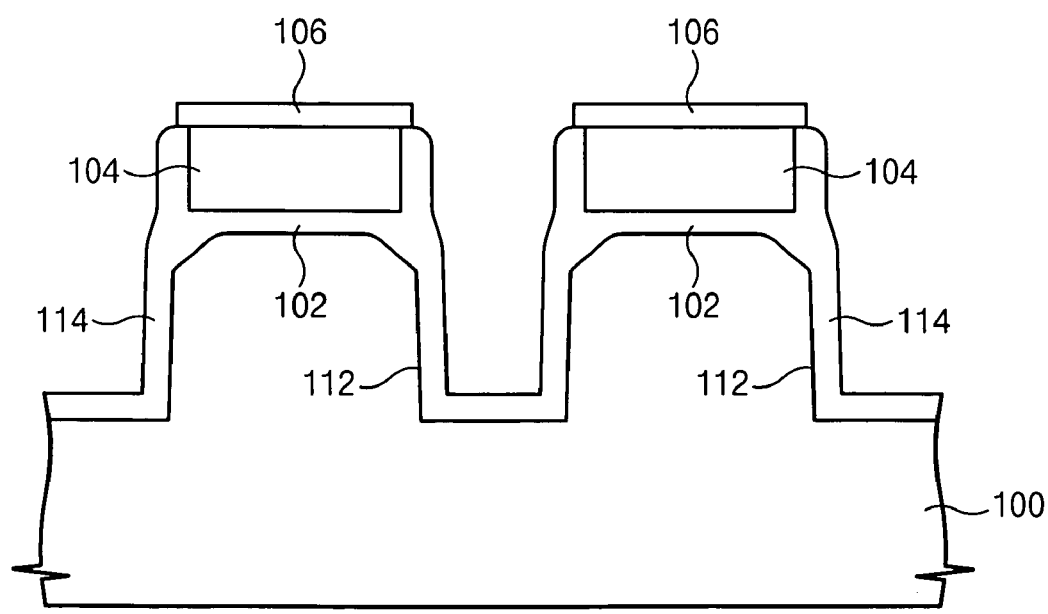

As illustrated in FIG. 4, a second oxidation process is performed for the substrate 100 where the trench 112 is formed. The second oxidation process may be an in-situ stem generation (ISSG) process performed under an ambient containing steam ($H_2O$), oxygen radical ($O^{2-}$), and hydroxyl radical ($OH^-$). The ambient may be made by supplying nitrogen and oxygen. The ISSG process may be performed at a temperature of about 950-1050 degrees centigrade and a pressure of about 7.5-20 Torr. A second oxide layer 114 is formed on the substrate 100 constituting a sidewall and a bottom of the trench 112 and on a surface of the mask nitride pattern 104. Due to the second oxidation process, a corner of the substrate 100 below both sides of the mask nitride pattern 104 may be further rounded.

Figure 5:
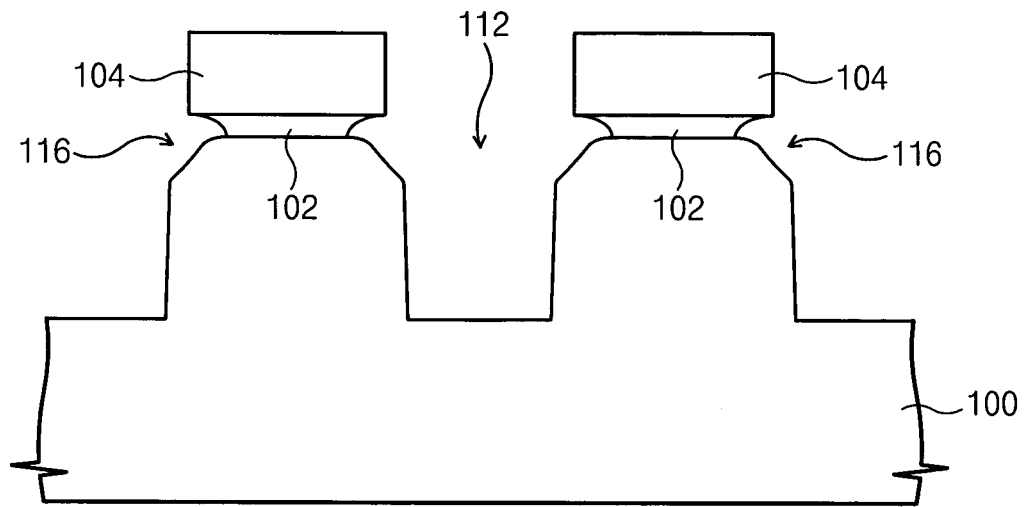

As illustrated in FIG. 5, a wet etch is conducted for the substrate 100 where the second oxide layer 114 is formed. The wet etch may use an etch solution containing, for example, hydrogen fluoride (HF). Due to the wet etch, the second oxide layer 114 is removed and both side ends of the pad oxide layer 102 and a portion of the mask oxide pattern 106 are removed. As a result, a facet or beveled region 116 is formed where a corner of the substrate 100 below both sides of the mask nitride layer is gently rounded at an upper portion of the trench 112.

Figure 6:
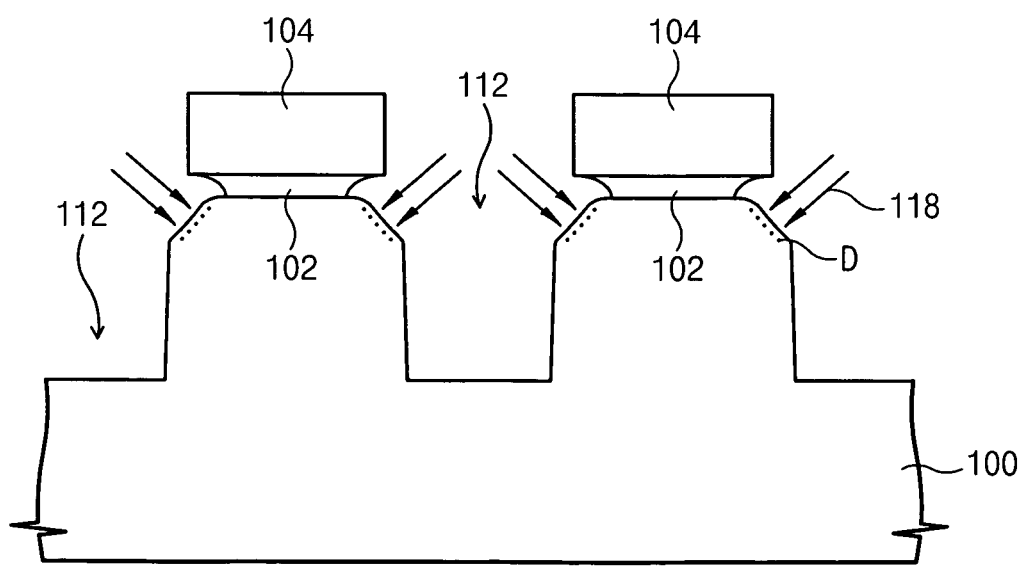

As illustrated in FIG. 6, an ion implanting process 118 is performed for the substrate 100 where the facet or beveled region 116 is formed. Due to the ion implanting process, defects "D" are made in the substrate 100 at the facet region 116. The ion implanting process may be performed at a tilt angle of about 0-60 degrees using boron (B), boron fluoride ($BF_2$), phosphorus (P), and/or arsenic (As). The ion implanting process may be performed at a dose of about $5.0 \times 10^{12}$ ions/$cm^2$ by supplying energy of about 30 KeV such that, for example, a projected range (Rp) becomes about 500 angstroms.

Figure 7:
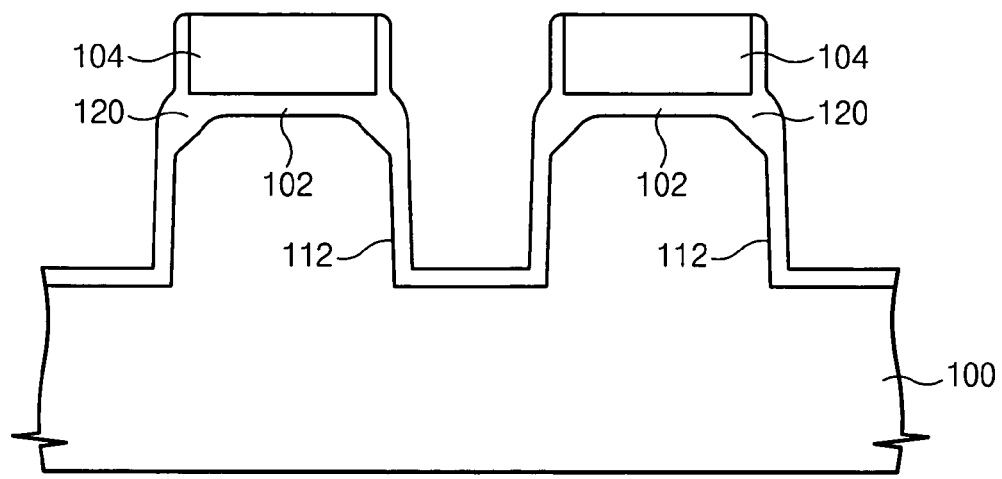

As illustrated in FIG. 7, a third oxidation process is performed for the ion-implanted substrate 100. The third oxidation process may be a low pressure radical oxidation (LPRO) process performed under an ambient containing $O^{2-}$ and $NO_x^-$. The third oxidation process may be performed at a lower pressure than the first and second oxidation processes, for example, at a pressure of about 0.4-9.0 Torr. Further, the third oxidation process may be performed at a temperature of, for example, about 900-1000 degrees centigrade. Due to the third oxidation process, a third oxide layer 120 is formed on the sidewall and bottom of the trench 112, the surface of the mask oxide pattern 106, and the substrate 100 at the facet region. Because of the defects "D" in the substrate 100 at the facet region 116 caused by the ion implanting process shown in FIG. 6, the third oxide layer 120 may be thickly formed over the substrate 100 at the facet region 116.

Figure 8:
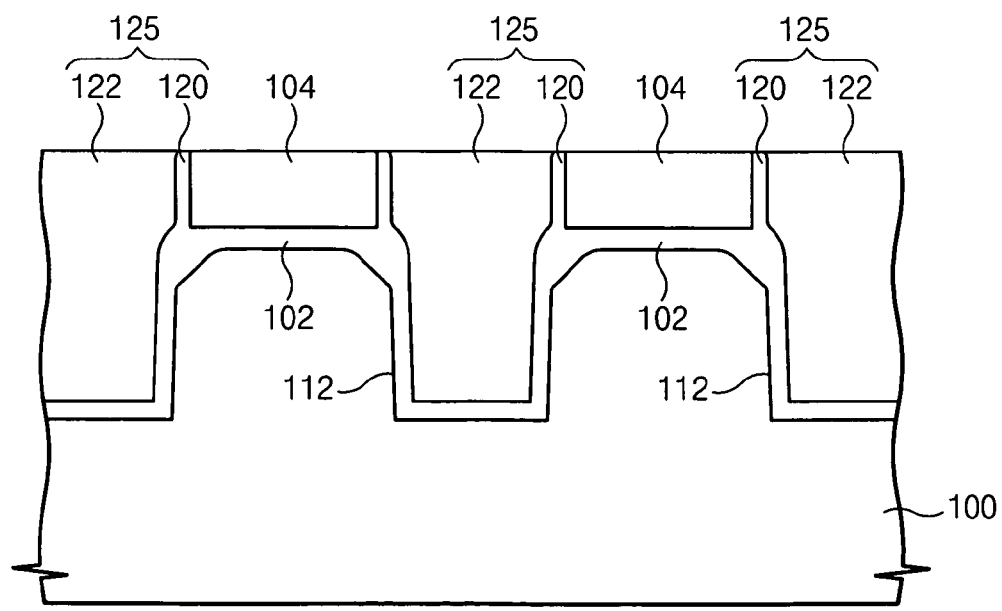

As illustrated in FIG. 8, the trench 112 is filled with a field isolation material. A planarization process is performed to expose the mask nitride pattern 104 and to form a gap-fill layer 122. The gap-fill layer 112 may comprise silicon nitride ($Si_3N_4$), hydrogen silsesquioxane (HSQ), boron phosphorus silicate glass (BPSG), and/or high density plasma (HDP) oxide. During the planarization process, the mask oxide pattern 106 is removed. In a subsequent process, the gap-fill layer 122 and the third oxide layer 120 constitute a filled isolation layer 125.

Figure 9:
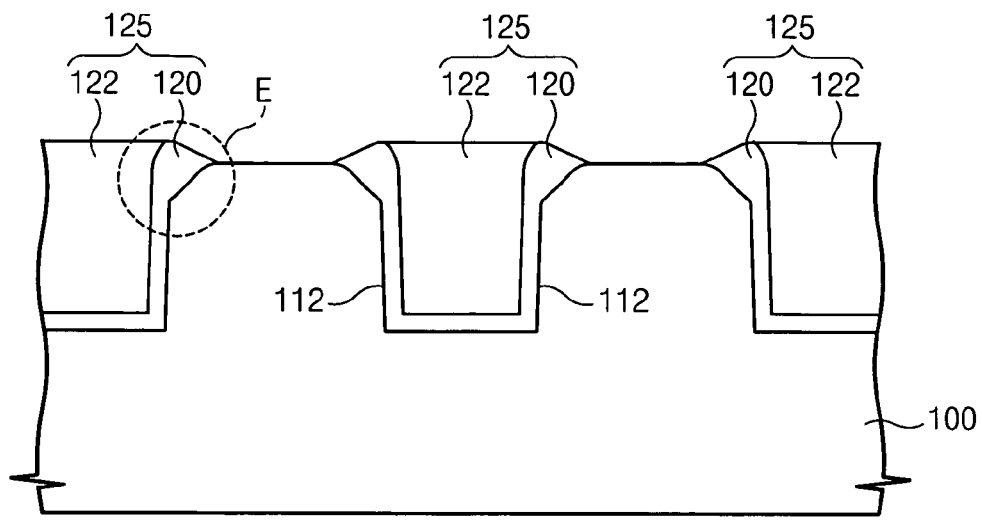

As illustrated in FIG. 9, the mask nitride pattern 104 is removed using an etch solution comprising phosphoric acid. A planarization process is performed to construct a field isolation layer 125, comprising the third oxide layer 120 and the gap-fill layer 122, and to expose the substrate 100.

In a subsequent process, an ion implanting process is performed on the exposed substrate 100 to form an impurity implanting area for controlling a threshold voltage. A thermal oxidation process is performed to form a gate oxide layer on the exposed substrate 100. A gate conductive layer is stacked and patterned to form a gate pattern of a MOS transistor. Alternatively, if the above-described process is applied to fabrication of a flash memory device, the gate oxide layer is a tunnel oxide layer and the gate conductive layer is a floating gate layer. Because the edge "E" of the field isolation layer 125 may be thickly formed at an upper portion of the trench 122, leakage current may be reduced or not generated while the MOS transistor or the flash memory device operates.

In other embodiments of the present invention, the first oxidation process may be omitted. Although the first oxidation process is omitted, the facet region 116 may be formed by the second oxidation process and defects may be caused by the ion implanting process of FIG. 6 to thickly form a third oxide layer 120 at an upper portion of the trench 112.

Methods of forming a field isolation layer according to further embodiments of the present invention will now be described with reference to FIG. 10 through FIG. 12. In these embodiments, procedures of forming a floating gate using self-alignment as applied to a flash memory device will be described.

Figure 10:
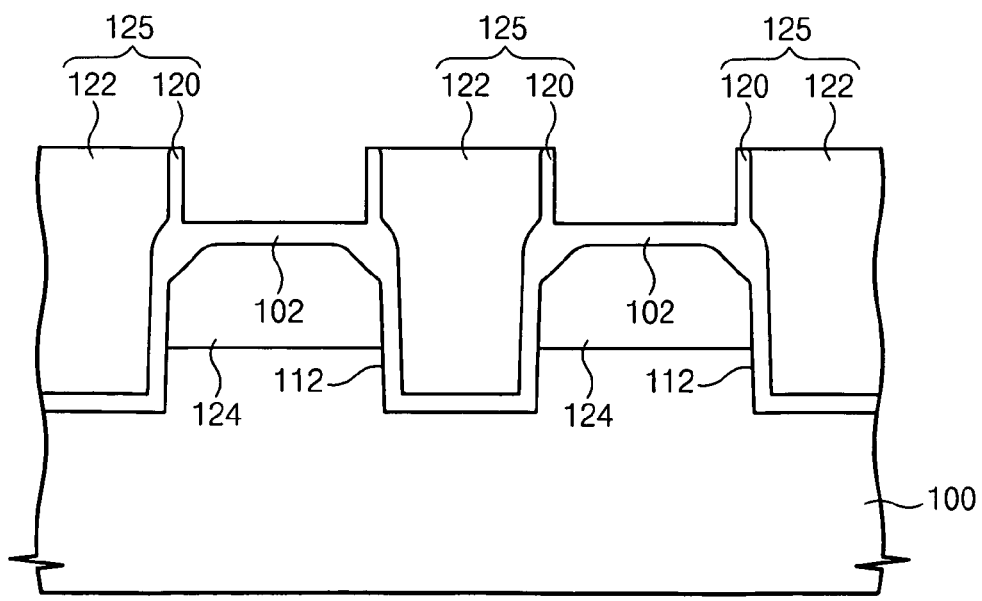
FIGS. 10-12 are cross-sectional diagrams that illustrate formation of a semiconductor device having field isolation layers according to further embodiments of the present invention.

As illustrated in FIG. 10, beginning with the device shown in FIG. 8, the mask nitride pattern 104 is removed to expose the pad oxide layer 102 and the third oxide layer 120. The removal of the mask nitride pattern 104 may be performed by a wet etch using an etch solution comprising, for example, phosphoric acid. Once the pad oxide layer 102 is exposed, an ion implanting process is performed on the substrate 100 to form an impurity implanting area 124. The impurity implanting area 124 may be formed for controlling a threshold voltage.

Figure 11:
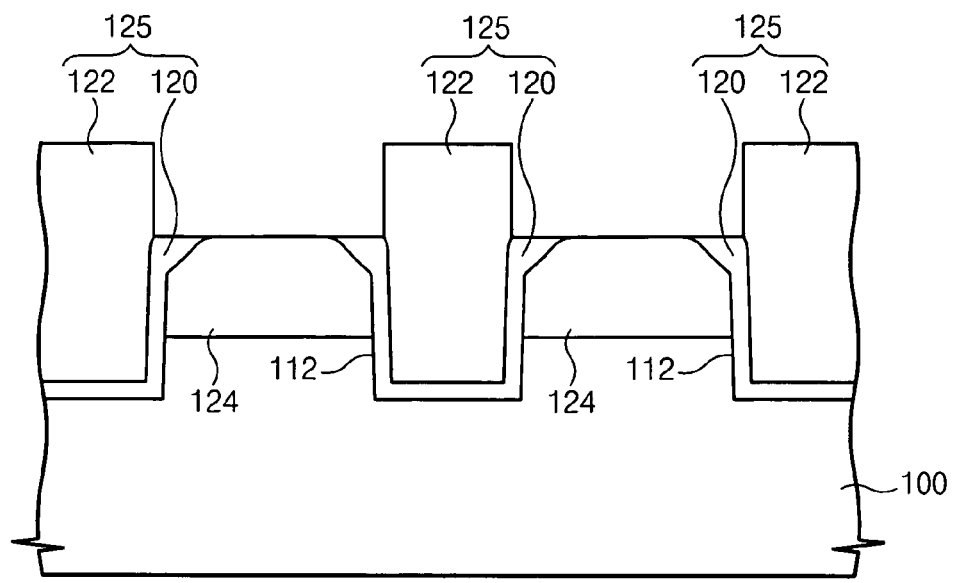

As illustrated in FIG. 11, a wet etch using an etch solution comprising, for example, hydrofluoric acid (HF) is performed to remove the pad oxide layer 102. The removal of the pad oxide layer 102 leads to exposure of the substrate 100 where the impurity implanting area 124 is formed. The third oxide layer 120 may be partially removed. Due to the first through third oxidation processes and the ion implanting process of FIG. 6, the third oxide layer 120 may be thickly formed at an upper portion of the trench 122. Therefore, the third oxide layer 120, even though partially removed, may be thicker than a conventional oxide layer.

Figure 12:
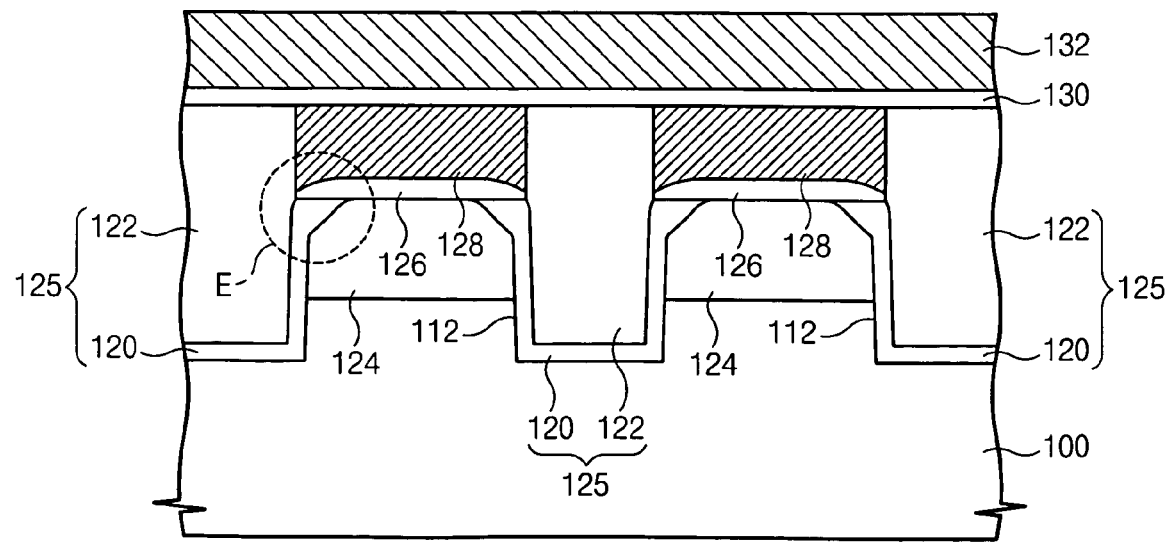

As illustrated in FIG. 12, a thermal oxidation process is performed under an oxygen ambient to form a tunnel oxide layer 126 on a surface of the exposed substrate 100. In a portion "E" where the substrate 100 and the gap-fill layer 122 are adjacent to each other at an upper portion of the trench 122, the oxygen supply may be reduced, which may prevent smooth formation of the tunnel oxide layer 126. An impurity-doped polysilicon layer 128 is stacked and planarized to form a self-aligned floating gate electrode 128. In a subsequent process, an intergate dielectric 130 and a control gate layer 132 are formed and patterned to form a flash memory device. Although the tunnel oxide layer 126 may be thinly formed at the portion "E," leakage current may be reduced or not generated when the flash memory device is programmed/erased or operates because the field isolation layer 125 is thickly formed.

In concluding the detailed description, it should be noted that many variations and modifications can be made to the embodiments without substantially departing from the principles of the present invention. All such variations and modifications are intended to be included herein within the scope of the present invention, as set forth in the following claims.

That which is claimed:

1. A method of forming a semiconductor device, comprising:
   providing a substrate;
   forming a trench in the substrate;
   forming beveled surfaces at upper portions of sidewalls of the trench opposite a bottom surface of the trench, respectively; and
   forming an oxide layer in the trench under an ambient comprising $O^{2-}$ and $NO_x^-$ such that the oxide layer is thicker on the beveled surfaces of the trench than on other surfaces of the trench.

2. The method as recited in claim 1, further comprising:
   forming defects in the beveled surfaces of the trench.

3. The method as recited in claim 2, wherein forming defects comprises:
   implanting ions in the beveled surfaces of the trench.

4. The method as recited in claim 3, wherein implanting ions comprises implanting ions in the beveled surfaces at a tilt angle of about 0-60 degrees.

5. The method as recited in claim 3, wherein implanting ions comprises implanting ions in the beveled surfaces using boron (B), boron fluoride ($BF_2$), phosphorus (P), and/or arsenic (As).

6. The method as recited in claim 1, further comprising:
   filling the trench with a field isolation material.

7. A method of forming a semiconductor device, comprising:
   sequentially stacking a pad oxide pattern and a mask pattern on a semiconductor substrate to expose the substrate;
   using the mask pattern as an etch mask, patterning the exposed substrate to form a trench;
   partially removing a corner of the substrate contacting the end of the pad oxide pattern at an upper end of the trench to form a facet region;
   performing an ion implanting process on the facet region to make defects;
   performing an oxidation process under an ambient comprising $O^{2-}$ and $NO_x^-$ to form a thick oxide layer on the facet region; and
   filling the trench with a field isolation material.

8. The method as recited in claim 7, wherein partially removing the corner of the substrate comprises:
   performing an oxidation process for the substrate including the trench to oxidize the corner of the substrate contacting the end of the pad oxide pattern; and
   performing an etch process to remove the oxidized corner.

9. The method as recited in claim 8, wherein performing the oxidation process for the substrate including the trench to oxidize the corner of the substrate comprises performing the oxidation process for the substrate including the trench to oxidize the corner of the substrate under an ambient containing steam ($H_2O$), oxygen radical ($O^{2-}$), and hydroxyl radical ($OH^-$).

10. The method as recited in claim 9, wherein the ambient comprises hydrogen ($H_2$) and oxygen ($O_2$).

11. The method as recited in claim 8, wherein the oxidation process to form the thick oxide layer is performed at a lower pressure than the oxidation process to oxidize the corner.

12. The method as recited in claim 8, further comprising:
    performing an oxidation process for the exposed substrate to form an oxide layer on the exposed substrate before forming the trench, the oxide layer being patterned when the trench is formed.

13. The method as recited in claim 12, wherein performing the oxidation process for the exposed substrate to form the oxide layer on the exposed substrate before forming the trench comprises performing the oxidation process for the exposed substrate to form the oxide layer on the exposed substrate before forming the trench under an ambient comprising steam ($H_2O$), oxygen radical ($O^{2-}$), and hydroxyl radical($OH^-$).

14. The method as recited in claim 13, wherein the ambient comprises hydrogen ($H_2$) and oxygen ($O_2$).

15. The method as recited in claim 12, wherein the oxidation process to form the thick oxide layer is performed at a lower pressure than the oxidation process to form the oxide layer on the exposed substrate.

16. The method as recited in claim 8, wherein performing the etch process comprises performing the etch process using hydrofluoric acid (HF) to remove the oxidized corner.

17. The method as recited in claim 7, wherein the ion implanting process is performed at a tilt angle of about 0-60 degrees.

18. The method as recited in claim 7, wherein the ion implanting process is performed using boron (B), boron fluoride ($BF_2$), phosphorus (P), and/or arsenic (As).

19. A method of forming a semiconductor device, comprising:
    stacking a pad oxide layer and a mask layer on a semiconductor substrate;
    patterning the mask layer and the pad oxide layer to form a pad oxide pattern and a mask pattern, which are sequentially stacked on the substrate, and to expose the substrate;
    performing an oxidation process for the exposed substrate to form an oxide layer on the exposed substrate and to simultaneously form a thick pad oxide layer below lateral ends of the mask pattern;
    using the mask pattern as an etch mask, patterning the oxide layer and the substrate to form a trench;
    performing an oxidation process for the substrate including the trench to oxidize a corner of the substrate contacting the end of the pad oxide pattern;
    performing an etch process to remove the oxidized corner and form a facet region;
    performing an ion implanting process on the facet region to make defects;
    performing an oxidation process to form a thick oxide layer on the facet region; and
    filling the trench with a field isolation material.

20. The method as recited in claim 19, wherein performing the oxidation process to form the thick oxide layer comprises performing the oxidation process to form the thick oxide layer under an ambient comprising $O^{2-}$ and $NO_x^-$.

21. The method as recited in claim 19, wherein performing the oxidation process for the substrate including the trench to oxidize the corner comprises performing the oxidation process for the substrate including the trench to oxidize the corner under an ambient containing steam ($H_2O$), oxygen radical ($O^{2-}$), and hydroxyl radical ($OH^-$).

22. The method as recited in claim 21, wherein the ambient comprises hydrogen ($H_2$) and oxygen ($O_2$).

23. The method as recited in claim 19, wherein the oxidation process to form the thick oxide layer is performed at a lower pressure than the oxidation process for the substrate including the trench to oxidize the corner.

24. The method as recited in claim 19, wherein performing the oxidation process for the exposed substrate to form the oxide layer on the exposed substrate comprises performing the oxidation process for the exposed substrate to form the oxide layer on the exposed substrate under an ambient comprising steam ($H_2O$), oxygen radical ($O^{2-}$), hydroxyl radical ($OH^-$).

25. The method as recited in claim 24, wherein the ambient comprises hydrogen ($H_2$) and oxygen ($O_2$).

26. The method as recited in claim 19, wherein the oxidation process to form the thick oxide layer is performed at a lower pressure than the oxidation process to form the oxide layer on the exposed substrate.

27. The method as recited in claim 19, wherein performing the etch process comprises performing the etch process using hydrofluoric acid (HF) to remove the oxidized corner.

28. The method as recited in claim 19, wherein the ion implanting process is performed at a tilt angle of about 0-60 degrees.

29. The method as recited in claim 19, wherein the ion implanting process is performed using boron (B), boron fluoride ($BF_2$), phosphorus (P), and/or arsenic (As).

* * * * *